United States Patent
Yoo et al.

(10) Patent No.: US 8,310,876 B2
(45) Date of Patent: Nov. 13, 2012

(54) METHODS OF ACCESSING STORAGE DEVICES

(75) Inventors: Han Woong Yoo, Seoul (KR); Jaehong Kim, Seoul (KR); Junjin Kong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 318 days.

(21) Appl. No.: 12/662,103

(22) Filed: Mar. 31, 2010

(65) Prior Publication Data

US 2010/0265764 A1    Oct. 21, 2010

(30) Foreign Application Priority Data

Apr. 17, 2009   (KR) .................. 10-2009-0033436

(51) Int. Cl.
    *G11C 16/04*    (2006.01)

(52) U.S. Cl. .................. 365/185.18; 365/185.11

(58) Field of Classification Search ............. 365/185.18, 365/185.11, 189.05; 711/114
     See application file for complete search history.

(56) References Cited

U.S. PATENT DOCUMENTS

2011/0258386 A1* 10/2011 Conley .................. 711/114
2012/0127799 A1*  5/2012 Bellorado et al. ....... 365/185.18

FOREIGN PATENT DOCUMENTS

| JP | 2006-221545 | 8/2006 |
| JP | 2007-004868 | 1/2007 |
| JP | 2007-004924 | 1/2007 |
| KR | 10-2009-0025631 | 3/2009 |

* cited by examiner

*Primary Examiner* — Vu Le
(74) *Attorney, Agent, or Firm* — Harness, Dickey & Pierce, P.L.C.

(57) ABSTRACT

Methods of accessing storage devices. The methods include rearranging a writing order of continuous first and second data according to a reading order, and writing the first and second data in a first and second storage region of the storage device, respectively, according to the writing order. The reading order reads the second storage region first that provides interference on the first storage region.

8 Claims, 17 Drawing Sheets

METHODS OF ACCESSING STORAGE DEVICES

CROSS-REFERENCE TO RELATED APPLICATIONS

This U.S. non-provisional patent application claims priority under 35 U.S.C. §119 of Korean Patent Application No. 10-2009-0033436, filed on Apr. 17, 2009, in the Korean Intellectual Property Office (KIPO), the entire contents of which is incorporated herein by reference.

BACKGROUND

Example embodiments of the inventive concepts relate to storage devices, and more particularly, to methods of accessing storage devices.

Semiconductor memory devices may be classified into volatile semiconductor memory devices and non-volatile semiconductor memory devices. A volatile semiconductor memory device may have a fast read and write speed, but may lose stored data once an external power supply is cut off. On the contrary, a non-volatile semiconductor memory device may retain stored data even when an external power supply is cut off. Therefore, a non-volatile semiconductor memory device may be used to store data that should remain regardless of power supply.

A flash memory is a non-volatile memory that may electrically erase data of multiple cells at once and thus may be extensively used in computers and memory cards. Flash memory may be classified into NOR type and NAND type according to a connection state of a cell and a bit line. In NOR flash memory, more than two cell transistors may be connected in parallel to one bit line, a channel hot electrode method may be used to store data, and a Fowler-Nordheim (F-N) tunneling method may be used to erase data. In NAND flash memory, more than two cell transistors may be connected in series to one bit line and a F-N tunneling method may be used to store and erase data.

Each memory cell of a flash memory device may store 1-bit data or multi-bit data. If 1-bit data is stored in one memory cell, a memory cell may have two threshold voltage states (e.g., threshold voltages corresponding to a data 1 and a data 0). If 2-bit data is stored in one memory cell, a memory cell may have threshold voltages corresponding to each of four data states. If 3-bit data is stored in one memory cell, a memory cell may have threshold voltages corresponding to each of eight data states. Recently, a variety of techniques for storing more than 4-bit data is actively under research.

SUMMARY

Example embodiments of the inventive concepts may provide methods of accessing storage devices resulting in improved access performance.

Example embodiments of the inventive concepts provide methods of accessing a storage device, the methods including rearranging a writing order of continuous first and second data according to a reading order and writing the first and second data in a first and second storage region of the storage device, respectively, according to the writing order, the reading order reading the second storage region first that provides interference on the first storage region.

Example embodiments of the inventive concepts provide methods of accessing a storage device, the methods including rearranging a writing order of first and second data according to a reading order and writing the first and second data into first and second storage regions of the storage device according to the rearranged writing order, the reading order reading data of the second storage region first, the second storage region interfering with the first storage region.

According to example embodiments of the inventive concepts, the first data to be outputted first may be written in the second storage region. The first data and the second data may be stored to rearrange the writing order. The second data may be stored by reading the second storage region, determining whether the first data are damaged or not by reading the first storage region, and if the first data are damaged, restoring the first data damaged according to the degree of the interference by referring to the stored second data. Restoring of the damaged first data may include re-reading the first storage region with a reading condition that is adjusted by referring to the degree of the interference. According to example embodiments of the inventive concepts, the restoring of the damaged first data may include detecting and correcting an error of the damaged first data by referring to the degree of the interference. The first and second data may be data of a page unit. The storage device may include non-volatile multi-level memory cells.

Example embodiments of the inventive concepts provide methods of accessing a storage device, the methods including rearranging a writing order of continuous first to third data according to a reading order and programming the first to third data into first to third storage regions of the storage device, respectively, according to the writing order, the reading order reading the first and third storage region first that provides interference on the second storage region. The second storage region may be between the first storage region and the third storage region.

Example embodiments of the inventive concepts provide methods of accessing a storage device, the methods including rearranging a writing order of first, second and third data according to a reading order; and programming the first to third data into first, second and third storage regions of the storage device according to the rearranged writing order, the reading order reading data from the first and third storage regions first, the first and third storage regions interfering with the second storage region.

Example embodiments of the inventive concepts provide methods of accessing a storage device, the methods including, receiving first and second data, the second data to be read out prior to the first data, rearranging a writing order of the first and second data based on a reading order, the writing order rearranged so that the second data is stored in one or more aggressor cells to be read first and the first data is stored in one or more victim cells, and writing the first data into the one or more victim cells and second data into the one or more aggressor cells.

BRIEF DESCRIPTION OF THE DRAWINGS

Example embodiments will be more clearly understood from the following brief description taken in conjunction with the accompanying drawings. FIGS. 1-15 represent non-limiting, example embodiments as described herein.

FIG. 1 is a schematic illustrating a non-volatile memory cell array according to example embodiments of the inventive concepts;

FIG. 2 is a graph illustrating threshold voltage shifts of a victim cell caused by aggressor cells;

FIG. 4 is a schematic illustrating cell array access methods according to example embodiments of the inventive concepts;

FIG. 5 is a diagram illustrating data rearrangement methods according to example embodiments of the inventive concepts;

FIG. 9 is a block diagram illustrating memory systems according to example embodiments of the inventive concepts;

FIG. 10 is a block diagram illustrating memory systems according to example embodiments of the inventive concepts;

FIG. 11 is a graph illustrating threshold voltage shift according to example embodiments of the inventive concept;

FIG. 12 is a schematic illustrating access methods of example embodiments of the inventive concepts compensating for threshold voltage shift illustrated in FIG. 11;

FIG. 13 is a block diagram illustrating memory systems according to example embodiments of the inventive concepts;

FIG. 14 is a block diagram illustrating fusion memory devices according to example embodiments of the inventive concepts; and FIG. 15 is a block diagram illustrating configurations of computing systems according to example embodiments of the inventive concepts.

Figure 1:
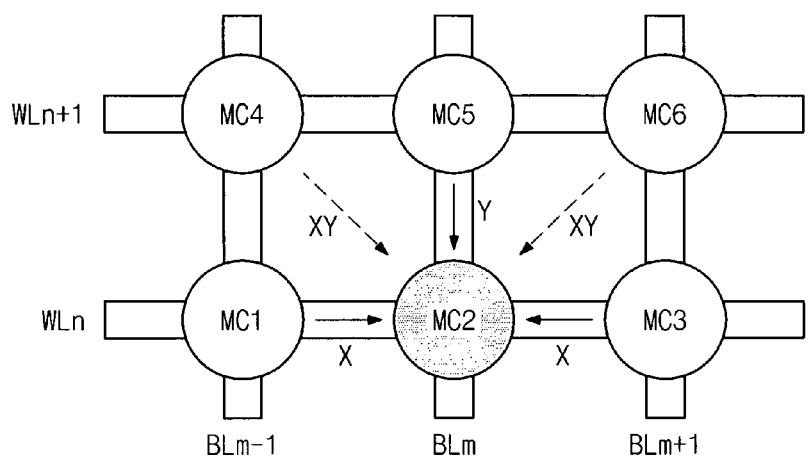

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the detailed description of example embodiments of the inventive concepts that follows, a non-volatile memory device as a storage device, especially, a NAND flash memory device is used as one example for illustrating features and functions of example embodiments of the inventive concepts. However, example embodiments of the inventive concepts are not so limited. Those skilled in the art may easily understand other advantages and performances of example embodiments of the inventive concepts according to the written description. A distribution as referred to herein may relate to a number of memory cells corresponding to a threshold voltage in memory cells of a specific unit (e.g., a page, a block, and/or a chip). The example embodiments of the inventive concepts may be embodied or applied according to other embodiments. Hereinafter, example embodiments of the inventive concepts will be described in detail with reference to the accompanying drawings.

FIG. 1 is a schematic illustrating a cell array of a non-volatile memory according to example embodiments of the inventive concepts. Referring to FIG. 1, during a program operation, a memory cell may be affected by interference from neighboring memory cells. For example, due to interference effects such as program disturb or coupling from neighboring memory cells, a threshold voltage of a memory cell may be unintentionally shifted. Due to memory cells MC1, MC3, MC4, MC5, and/or MC6 providing the above interference, data stored in a memory cell MC2 may be damaged. Hereinafter, a memory cell providing interference (e.g., MC1, MC3, MC4, MC5, and/or MC6) may be called an aggressor cell and a memory cell whose threshold voltage is shifted unintentionally due to the above interference may be called a victim cell. FIG. 1 may illustrate example interference of aggressor cells shifted along X, Y and XY directions.

A typical phenomenon that may shift a threshold voltage of a victim cell may be described as a coupling or program disturb phenomenon. In addition to a coupling or program disturb phenomenon, a threshold voltage of a memory cell may be shifted due to various factors. For example, threshold voltages of memory cells may be shifted (e.g., decreased and/or increased) due to deterioration of an oxide layer caused by time elapse, hot temperature stress (HTS), and/or program/erase cycle increase. Because of device characteristics, like a floating gate of a charge trap flash memory (CTF), distribution may deteriorate due to lateral charge spreading in which electric charges move to neighboring memory cells. This threshold voltage shift phenomenon may not be limited to influence from adjacent memory cells. The threshold voltage shift may be caused by influence from memory cells of the same word line WL (e.g., WLn and/or WLn+1) or bit line BL (e.g., BLm−1, BLm and/or BLm+1), or by a write method and a pattern of data. The threshold voltage shift in the victim cell MC2 may not be limited to a specific factor. Example embodiments of the inventive concepts may vary according to the tendency or degree of interference that one or more aggressor cells affect a victim cell.

According to interference from aggressor cells, threshold voltages of memory cells may be shifted in an unintentional direction. Aggressor cells and victim cells may be a relative concept. A memory cell regarded as an aggressor cell during a current program operation may become a victim cell receiving interference during the next program operation. According to a programming sequence, a memory cell may serve as a victim cell or an aggressor cell. Whether a cell is a victim cell or aggressor cell may depend on whether data stored in victim cells may be influenced (e.g., damaged and/or corrupted) by interference. A technique for restoring data damaged due to interference may be described.

Figure 2:
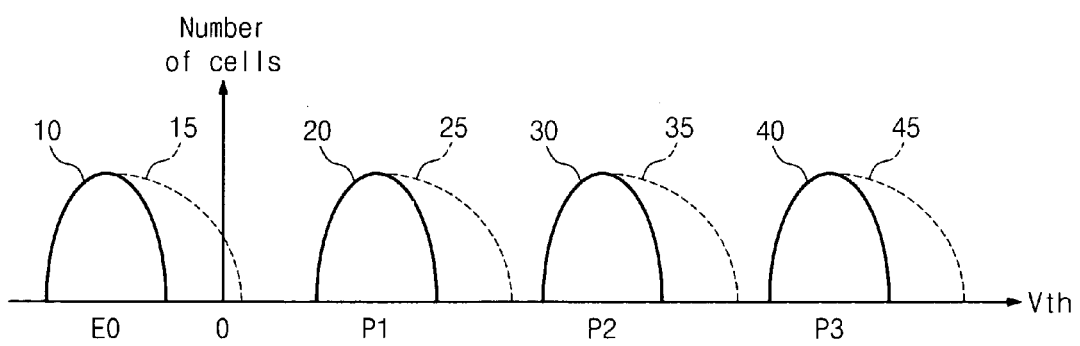

FIG. 2 is a graph illustrating threshold voltage shifts of a victim cell caused by one or more aggressor cells. FIG. 2 may illustrate a result of interference that victim cells receive from neighboring aggressor cells. FIG. 2 may illustrate a threshold voltage distribution of a victim cell whose threshold voltage is shifted as aggressor cells (e.g., memory cells that will be programmed later) are programmed. An erase state E0 corresponding to data 11 may have the lowest threshold voltage level. Respective 2-bit data and program states may be arranged with a program state P1 corresponding to data 10, a program state P2 corresponding to data 00, and a program state P3 corresponding to data 01. A relationship of 2-bit data corresponding to the states E0, P1, P2, and P3 is an example and other relationships are possible. According to a design method of a memory device, the states E0, P1, P2, and P3 and 2-bit data corresponding thereto may vary. Although a 2-bit multi-level cell (MLC) may be illustrated as an example for convenience of description, it is apparent to those skilled in the art that the same techniques of example embodiments of the inventive concepts may be applied to a 3-bit MLC or a 4-bit MLC.

After a program operation is completed, threshold voltage of memory cells may form distributions 10, 20, 30, and 40 indicated with a solid line. Once adjacent aggressor cells are programmed, a threshold voltage of memory cells (e.g., victim cells) may shift into distributions indicated with a dotted line. For example, a threshold voltage of victim cells among memory cells programmed with the distribution 10 may expand into the distribution 15 due to interference from aggressor cells. A threshold voltage of victim cells among memory cells programmed with the distributions 20, 30, and 40 may expand into the distributions 25, 35, and 45, respectively, due to interference from aggressor cells. The data of the victim cells whose threshold voltages expand to the distributions 25, 35, and 45 may be re-read with reference to program states of aggressor cells or may be rewritten by an additional data process. If a program state of aggressor cells is a high threshold voltage or provides an immense and/or increased interference, a re-read operation may be performed by adjusting a read voltage of victim cells. According to example embodiments, damaged data of victim cells may be restored by referring to the tendency and/or degree of interference without a re-read operation on victim cells.

Figure 3A:
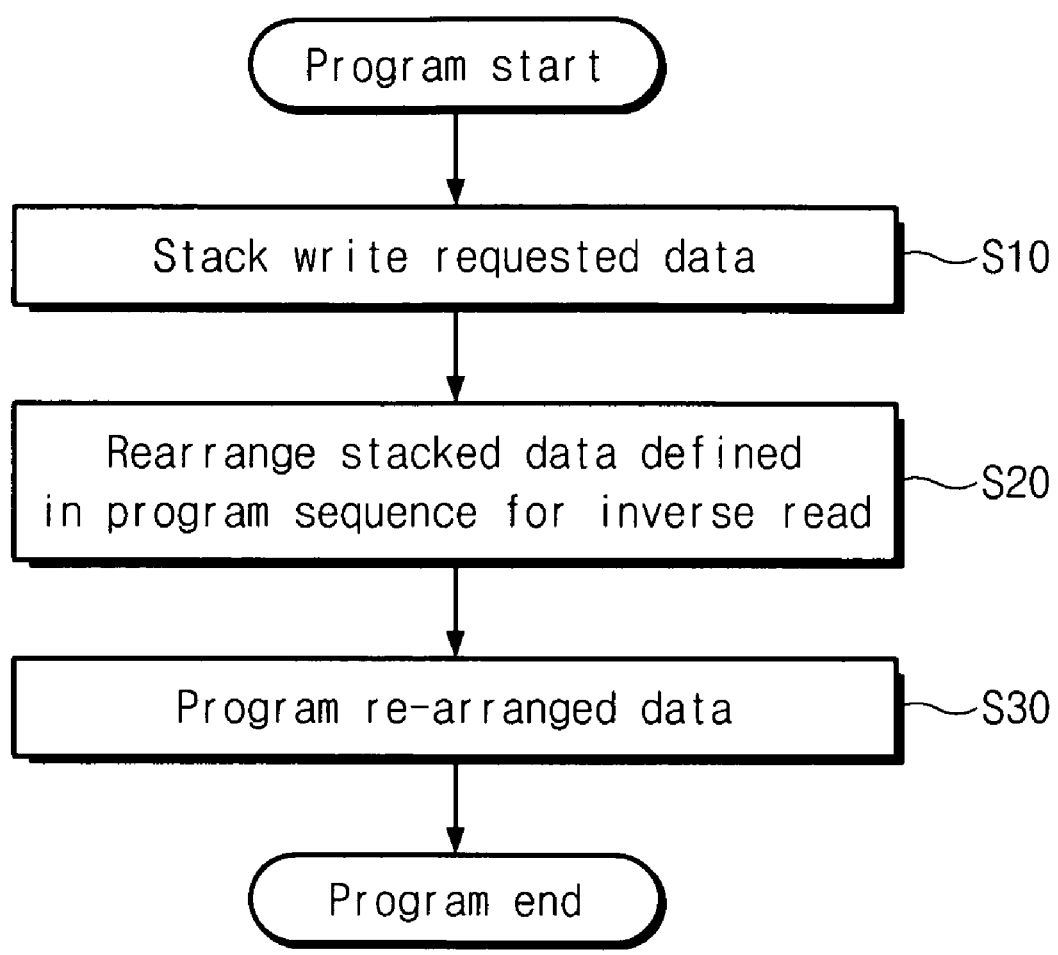
FIGS. 3A and 3B are flowcharts illustrating programming methods and read methods according to example embodiments of the inventive concepts.
Figure 3B:
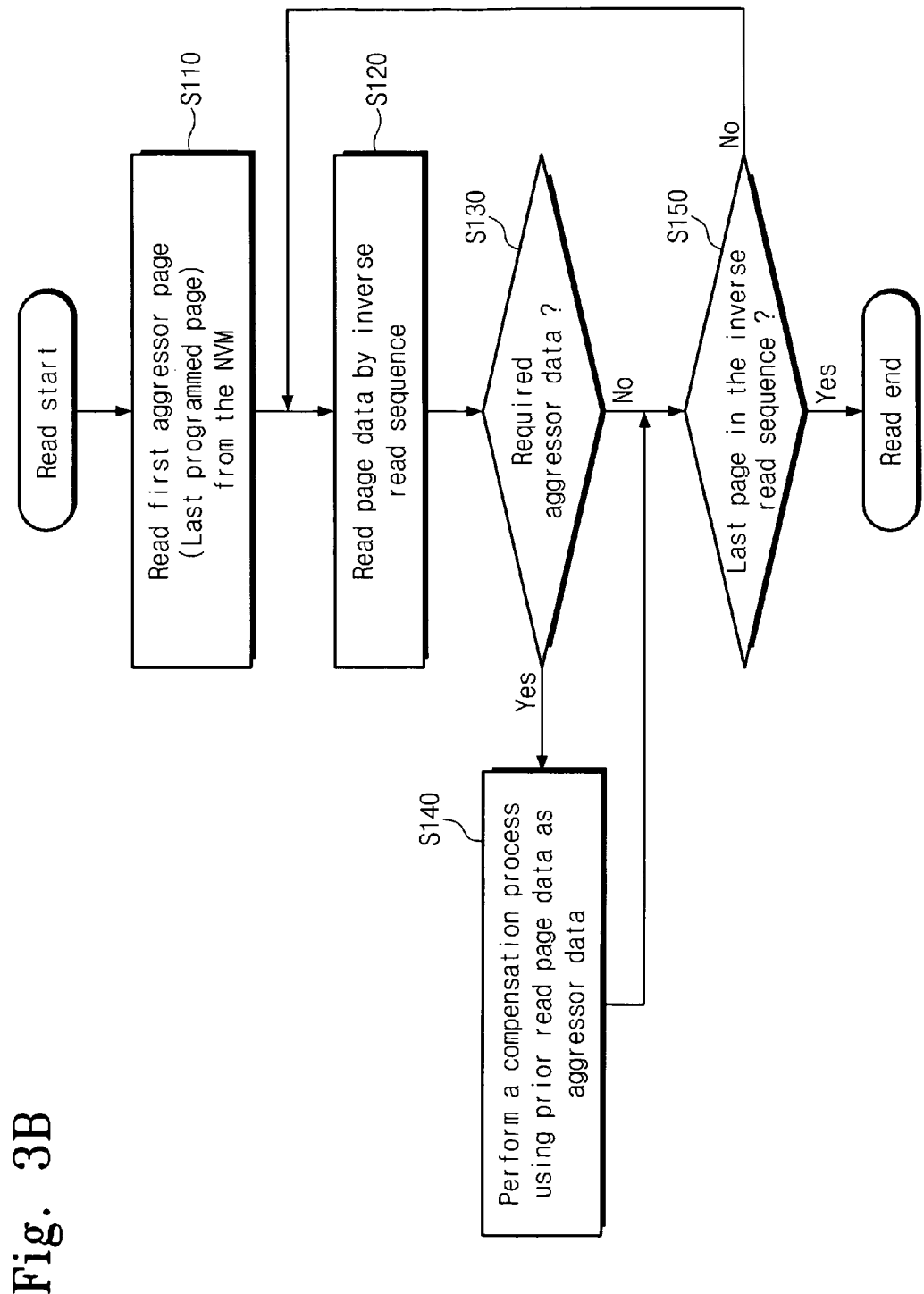

FIGS. 3A and 3B may illustrate access procedures according to example embodiment of the inventive concepts. FIG. 3A may illustrate a program procedure and FIG. 3B may illustrate a read procedure. Referring to FIG. 3A, a program operation of example embodiments of the inventive concepts will be described. Once a write request is given by a host or a user, a program operation according to example embodiments of the inventive concept may start. It is assumed for purposes of illustration that the write requested data has a size of a plurality of pages. For example, the write requested data may be media data that may be continuously provided from a host in order for storage. The write requested data may be buffered or stacked first in a temporary storage (e.g., a write buffer) in operation S10.

Referring to operation S20, the stacked data may be rearranged according to a program sequence. For example, the stacked data may be rearranged by a page unit that is a data size written during one program operation. The stacked data may also be rearranged according to a program sequence for inverse read according to example embodiments of the inventive concepts. Inverse read may be defined as a method for reading memory cells that have an order opposite to a program sequence and/or the inverse read may include a method for reading a portion of memory cells that have an order opposite to a program sequence. The inverse read may be defined as a read operation for reading data stored in aggressor cells prior to data stored in victim cells. By reading data stored in aggressor cells first, the data may be used to compensate for the damaged data of victim cells. Rearrangement of the stacked data for programming may be directly provided to a host or a user without processing during an inverse read operation.

Referring to operation S30, a program operation of a page unit of rearranged data may be performed. The rearranged data may be programmed with a shadow program method for reducing interference in a memory system employing an MLC in operation S30. The program procedure may be described briefly. The above-mentioned inverse read may vary according to characteristics of a memory device. Data write-requested from a host, or stacked data buffered in a temporary storage, may be data whose outing order is important during a read operation. For example, the data may be a large volume of media data such as a video or a sound source. If the data is processed according to a program method or a read method of example embodiments of the inventive concepts, service deterioration caused by damaged data may be decreased and/or minimized.

FIG. 3B is a flowchart illustrating an example of the above mentioned inverse read. Once a write request is given from a host, an access for memory cells may be performed according to an inverse read procedure that reads data of aggressor cells first. Data may be read by accessing a first aggressor page. The first aggressor page may be a page that is programmed last, for example. The first aggressor page may correspond to a page that is programmed last among a write requested data during a program operation. The first aggressor page is not limited to the last programmed page according to example embodiments of the inventive concepts. The first aggressor page may correspond to memory cells that purely serve as aggressor cells. The first aggressor page may be data that is affected little by interference from programming of adjacent memory cells. The reading of data of a first aggressor page may mean that the accurate size of pages that are sequentially read from the first aggressor page may be obtained in operation S110.

Referring to operation S120, according to an inverse read procedure, a read operation for the next page may be performed in operation S120. Pages read after the first aggressor page may be read with data damaged by aggressor cells. A detection procedure (e.g., an error detection operation) determining whether data in the read page are damaged may be performed in operation S130. According to the detection of whether the data in a read page is damaged or not, it may be detected whether data of previously read aggressor page may be required to restore data of the read page. According to an error correction or other algorithms, the damaged data may be restored without data read from an aggressor cell. If the data read from the aggressor cell is not required, operation S150 for detecting whether data of a currently read page is final page data may be performed.

If the damaged data of the currently read page may not be restored by an error correction or other algorithms, operation S140 for restoring damaged data with reference to data read from an aggressor cell may be performed. In order to restore the damaged data of a currently read page, the immediately prior read page may be used. With reference to more than two previously read pages that are not the currently read page, the size of interference that may affect victim cells storing the currently read page data may be measured. With reference to the size of the estimated interference, a re-read operation for the currently read page can be performed. According to example embodiments of the inventive concepts, by performing a processing operation according to the size and trends of the interference, a currently damaged page data may be restored without a re-read operation.

Operation S150 may be performed to detect whether currently read page data is final page data (e.g., last page to be read). If the currently read page is not the last page of the read requested data, operation S120 for reading a next page may be performed. An inverse order read loop may repeat until the final page is read. If the currently read page is the last page of the read requested data, a general read operation of data according to the read request may be completed.

According to the above-described read procedure, data of an aggressor cell providing interference to a currently read page may be previously read and stored in a storage element (e.g., a buffer or a latch). In order to correct an error of the currently read page, a repetitive read operation of an aggressor cell may be unnecessary. Through a data rearrangement operation performed during a program operation a stream data may be provided in an order that a user requests by the inverse read. Data outputted through the inverse read can be directly provided to a host without an additional arrangement process.

Figure 4:
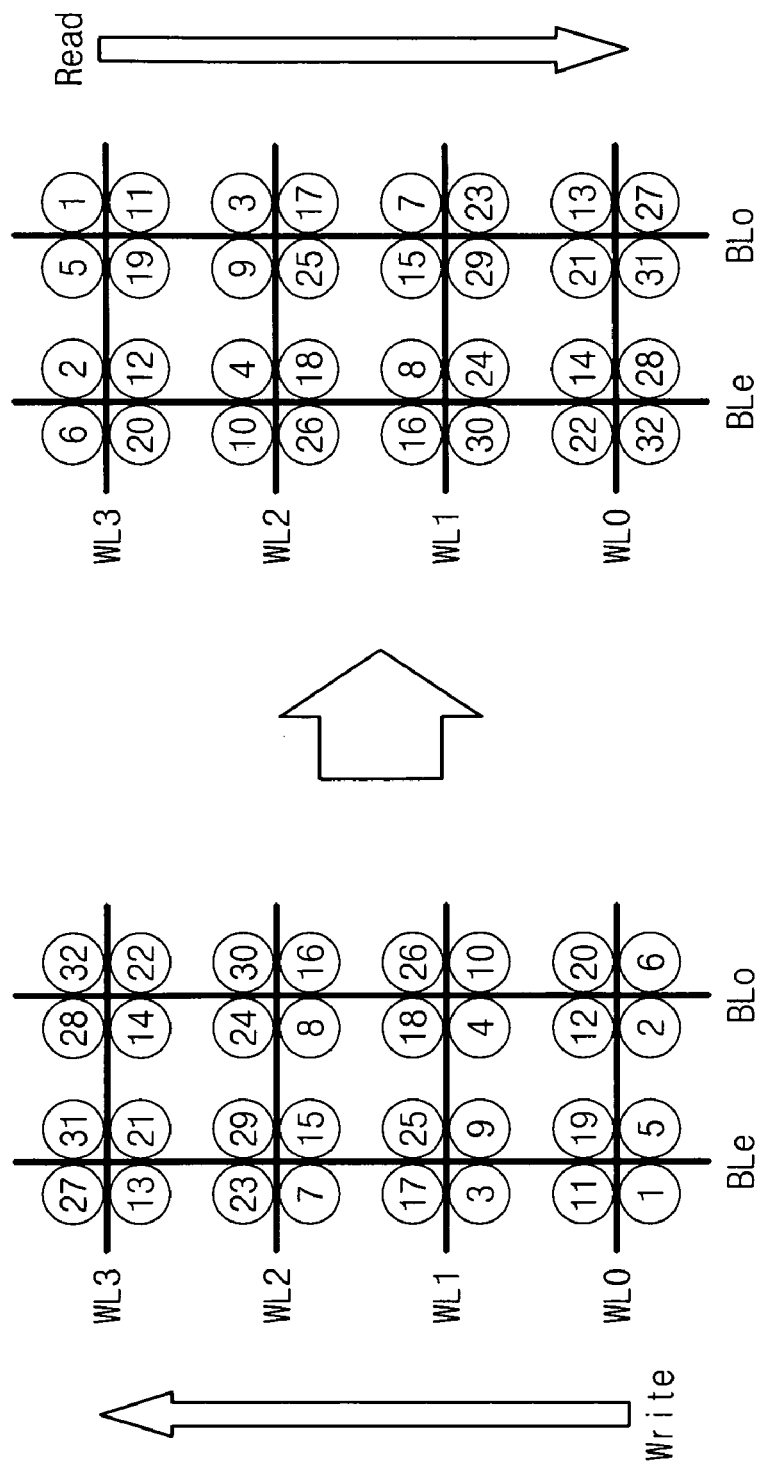

FIG. 4 is a schematic illustrating cell array access methods according to the example embodiments of the inventive concepts. FIG. 4 may illustrate program procedures and the inverse read procedures of FIGS. 3A and 3B performed on a cell array. Referring to FIG. 4, example embodiments of the inventive concepts may be described with reference to a 4-bit MLC disposed on an intersection point of four word lines WL0-WL3 and even and odd bit lines BLe and BLo. During a program operation, a plurality of pages (e.g., 32 pages shown as numbers 1-32) may be programmed in numerical order according to FIG. 4. A program sequence of a plurality of pages may vary according to an order of inverse read of example embodiments of the inventive concepts as shown in FIG. 3. If pages provided to a flash memory device according to a rearrangement of data to be programmed are outputted according to inverse read, they may be output in an order that a host may require.

A program sequence of a memory cell may be performed by a shadow program method, for example, in order to minimize and/or reduce interference of a typical 4-bit MLC. As shown in FIG. 4, inverse read may be performed through a complete inverse order of a program sequence. A reading order may be completely an inverse order and/or may be partially an inverse order. A rearrangement method for a plurality of write requested pages may be described with reference to FIG. 5.

Figure 5:
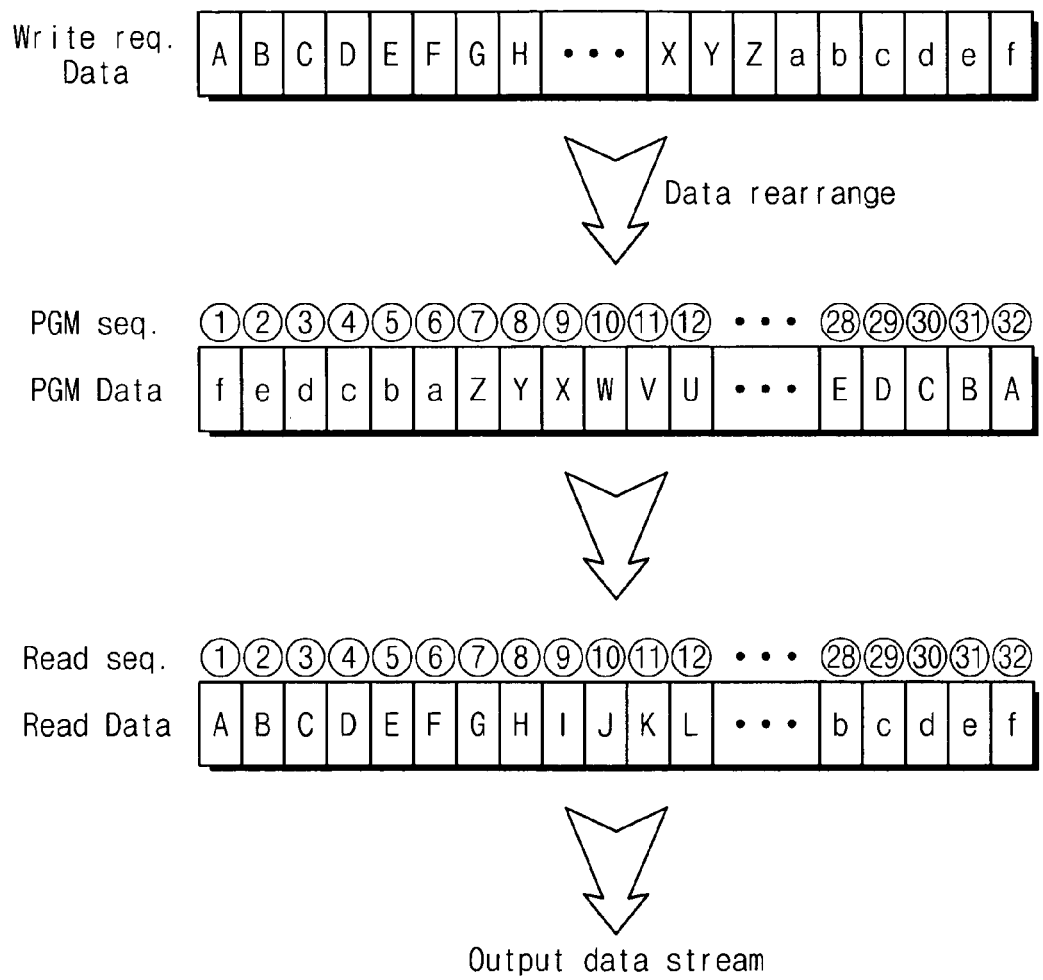

FIG. 5 is a diagram illustrating data rearrangement methods according to example embodiments of the inventive concepts. FIG. 5 may illustrate program and read operations. Referring to FIG. 5, a plurality of pages A, B, f may be, for example, provided from a host alphabetically. A page sequence in which a host provides the pages A, B, C, . . . , f may be used, for example, for reading. Although a plurality of pages A, B, C, ..., f is shown, example embodiments are not limited to a number of alphabetical characters, which are shown for illustrative purposes only. According to FIG. 5, write requested data Write req. Data from a host may show an order of write data provided from a host. For example, a host may write-request a memory device of example embodiments of the inventive concepts with respect to media data that may need to be continuously provided (e.g., streamed video and/or sound data). The 32 pages A, B, C, ..., f may correspond to write data stored in a buffer.

If the write requested page is programmed or read according to the program and read procedures of FIG. 4, the write requested data may be rearranged according to a program sequence. An order to be programmed may be programmed with an inverse order of data provided from a host. The last write requested page f may correspond to a program sequence ①. A page e may be arranged to be allocated to a program sequence ②. The first write requested page A may be allocated to the 32$^{nd}$ program sequence to be programmed. Based on the reading order of FIG. 4, the read data may be provided to the host with the same order as the order of page data provided from the host. When data is read, for example, in the reading order of FIG. 4, the outputted data may follow an order of A->B->C->D-> ... ->e->f.

Figure 6A:
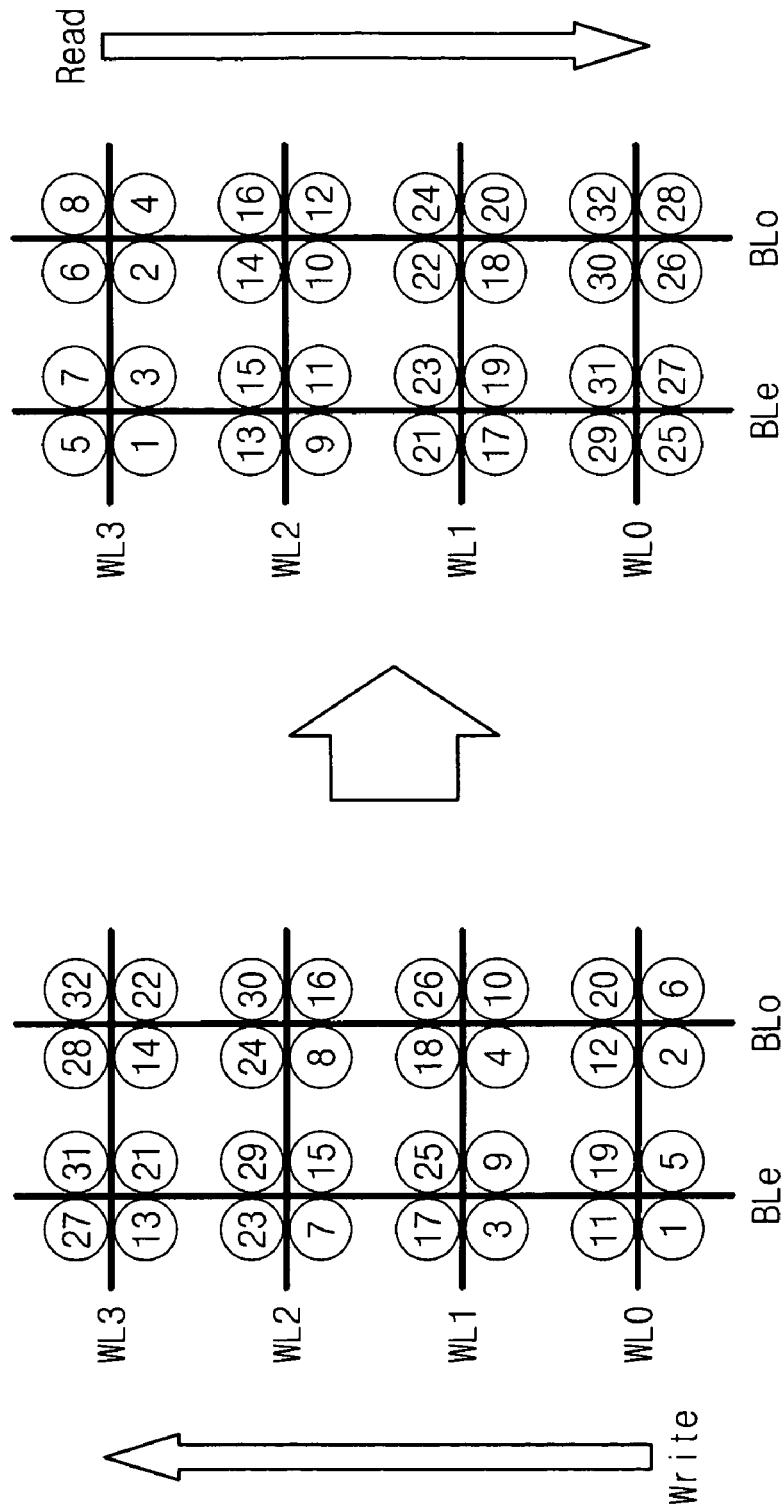
FIGS. 6A and 6B are a schematic and a diagram, respectively, illustrating example embodiments of the inventive concepts.
Figure 6B:
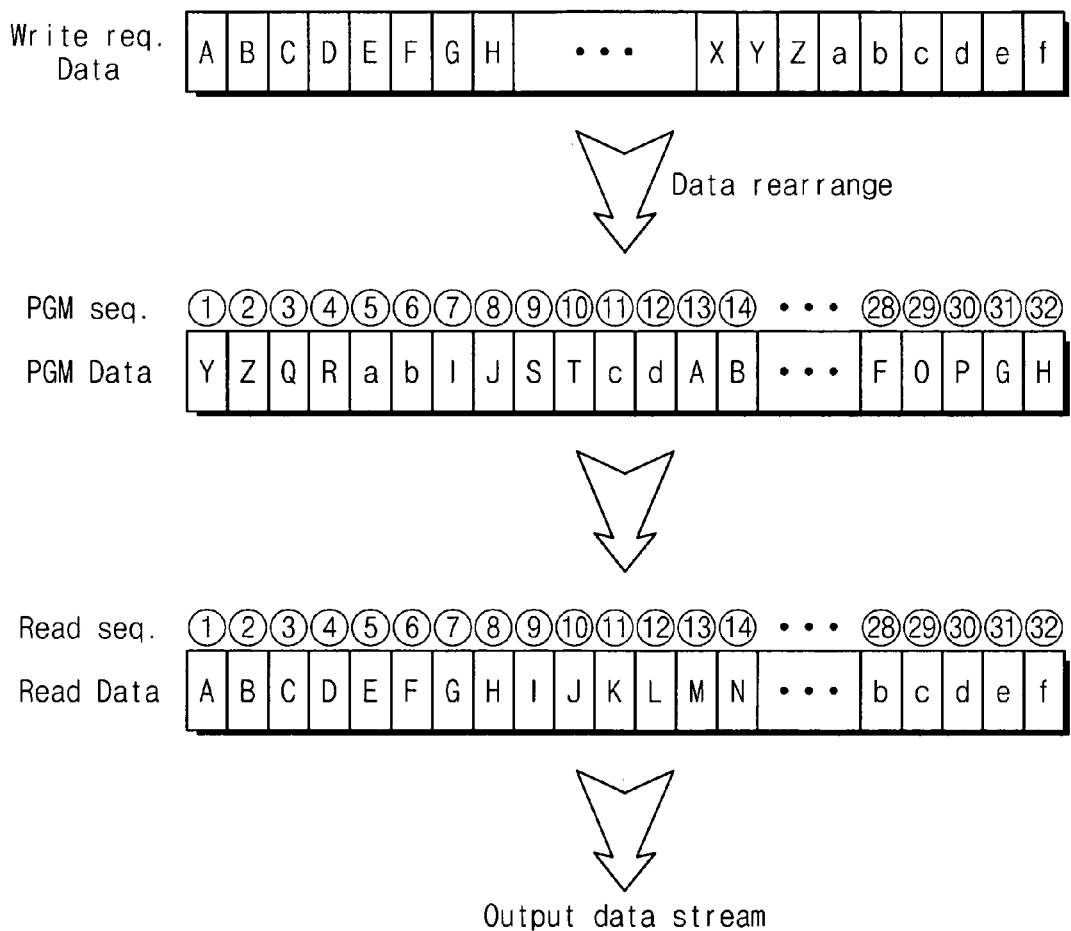

FIGS. 6A and 6B are a schematic and a diagram, respectively, illustrating example embodiments of the inventive concepts. FIGS. 6A and 6B may illustrate access methods according to example embodiments of the inventive concepts. The inverse read of FIG. 6A may not be in an inverse order of program, but only a word line selected during a read operation may be selected with an inverse order. After reading of memory cells connected to word line WL3 is finished, four pages stored in memory cells connected to a word line WL2 may be sequentially read. The program sequence of memory cells may be the same as that of FIG. 4, but the reading order may be by word line unit (e.g., data may be read one wordline at a time). Data rearrangement according to FIG. 6B may be required in order to perform the inverse read operation by a word line unit.

Referring to FIG. 6B, a plurality of pages A, B, C, ..., e, f provided from a host may be allocated to the next program sequence. A page Y may be allocated to a program sequence ① to be programmed initially (e.g., Y corresponds to a 25$^{th}$ page in numerical/alphabetical order corresponding to the first page written and the 25$^{th}$ page read according to FIG. 6A). A page Z may be arranged to be allocated to a program sequence ②. Each page may be allocated with a program sequence having an order of Q->R->a->b-> ... ->G->H. During a read operation, four pages of a memory cell connected to the word line WL3 may be read in order from a least significant bit (LSB) page to a most significant bit (MSB) page. The read data may be provided to a host again with the same order as the order of page data provided from a host. If data is detected using the inverse read method of FIG. 6A, the outputted data may follow an order of A->B->C->D-> ... -> e->f.

Figure 7A:
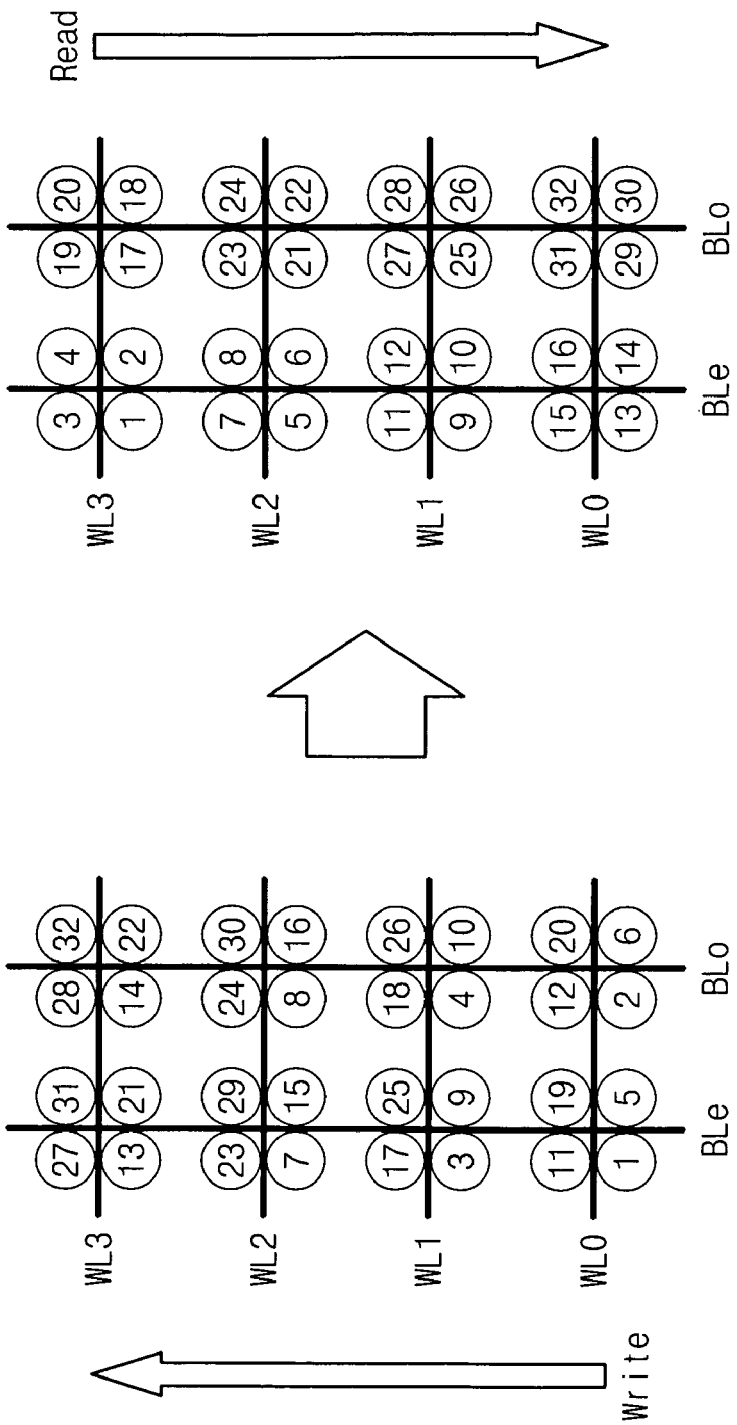
FIGS. 7A and 7B are a schematic and a diagram, respectively, illustrating example embodiments of the inventive concepts.
Figure 7B:
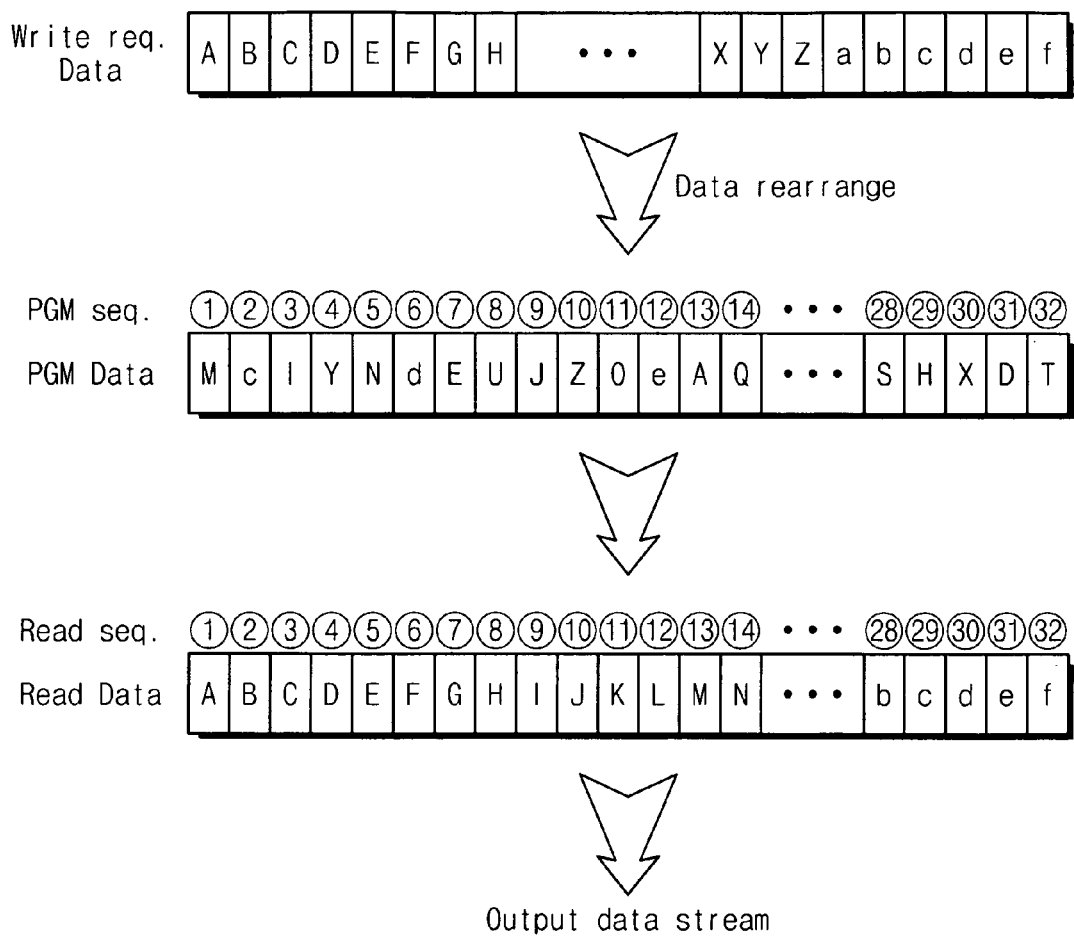

FIGS. 7A and 7B are a schematic and a diagram, respectively, illustrating example embodiments of the inventive concepts. FIGS. 7A and 7B may illustrate access methods according to example embodiments of the inventive concepts. In relation to inverse read of FIG. 7A, after reading of a plurality of pages stored in memory cells corresponding to an even page, a plurality of pages stored in an odd page may be read (e.g., reading may precede by bit line). During a program operation, even and odd pages may be programmed alternately, but during a read operation, after reading of an even page in a selected area, data stored in an odd page may be read. In order to make this inverse read possible, addressing of a memory device and data rearrangement may be required.

Referring to FIG. 7A, during a read operation, reading of all page data with respect to an even bit line BLe of a page may be performed first. Selecting of a word line may select the upper word line first. A word line is selected in inverse order. After multi-bit data of memory cells corresponding to an even bit line BLe among memory cells connected to the word line WL3 are read, data having an even page address connected to the word line WL2 may be read. Even page data of the word line WL1 and WL0 may be sequentially read. Once the last even page of the word line WL0 is read, odd pages may be read from the word line WL3 in inverse order.

Referring to FIG. 7B, a program sequence of a plurality of pages A, B, C, ..., e, f provided from a host may be shown. A page M may be allocated to a program sequence ① to be programmed initially. A page c may be allocated to a program sequence ②. A program sequence may be allocated in an order of each page I->Y->N->d-> ... ->D->T. According to inverse read for an even page and inverse read for a continuous odd page during a read operation, a data stream order provided from a host may be provided. If data is read, the outputted data may follow an order of A->B->C->D-> ... -> e->f.

According to read methods of example embodiments of the inventive concepts, data of a page corresponding to aggressor cells may be read prior to data of victim cells. When damaged data of a page is restored with reference to data of an aggressor cell, an additional read operation may not be required. According to algorithms of example embodiments, the number of read operations may be reduced. By introducing methods according to example embodiments, interference effects such as coupling may be reduced with decreased performance deterioration. When algorithms according to example embodiments are applied, read disturb and power consumption may be reduced.

Algorithms according to example embodiments may be embedded in a memory controller, a driver of a host, and/or a NAND chip, for example. When damaged data using the above-described inverse read are restored, the scope of an aggressor cell may expand to all previously-programmed pages. Accurate recovery may become possible and reliability of data may be increased.

Figure 8A:
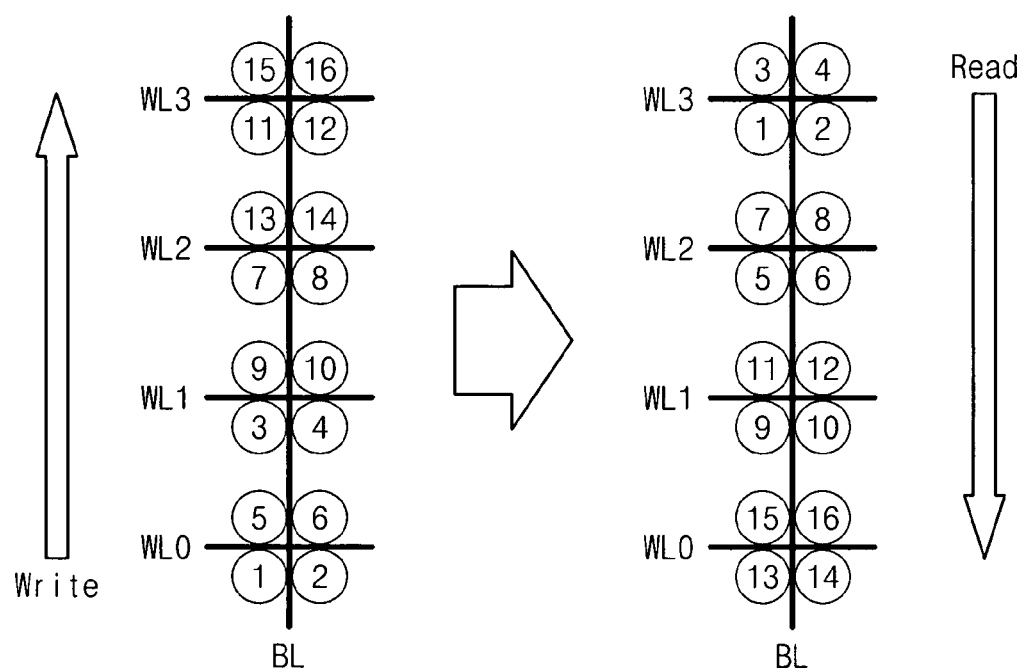
FIGS. 8A and 8B are a schematic and a diagram, respectively, illustrating example embodiments of the inventive concepts.
Figure 8B:
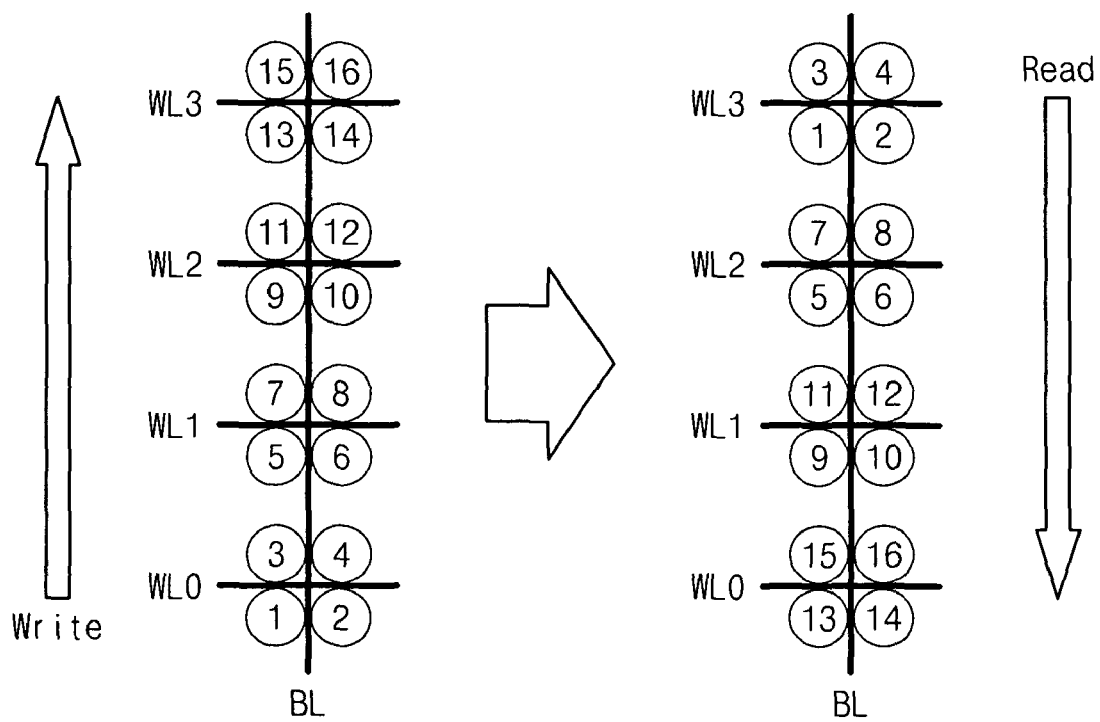

FIGS. 8A and 8B are schematics illustrating example embodiments of the inventive concepts. Example embodiments may include application to any cell structure and FIGS. 8A and 8B may illustrate application of the inventive concepts to a cell array structure (e.g., an all bit line structure) that may be different from an even and odd bit line structure, as described above. Access methods of example embodiments of the inventive concepts may be applied without limitation to write and read methods of a memory cell.

Referring to FIG. 8A, program methods may be disclosed in which one word line may be selected, two pages may be programmed sequentially or simultaneously, and a next word line may be selected. According to this program sequence, inputted data may be rearranged. The rearranged data may be programmed into a cell array. During a read operation, data may be detected and outputted based on the inverse read performed according to the shown order. FIG. 8B may illustrate example embodiments in which four pages may be programmed continuously or simultaneously into memory cells connected to a selected word line. The LSB page to the MSB page may be continuously programmed into the selected memory cell. The reading order may be performed based on the inverse read as shown above.

According to example embodiments of the inventive concepts described above, the data rearrangement and inverse read may be realized. Example embodiments of the inventive concepts are not limited to specific program and read methods, and may be applied to all program methods for maintaining reading consistency of entire or partial data.

Figure 9:
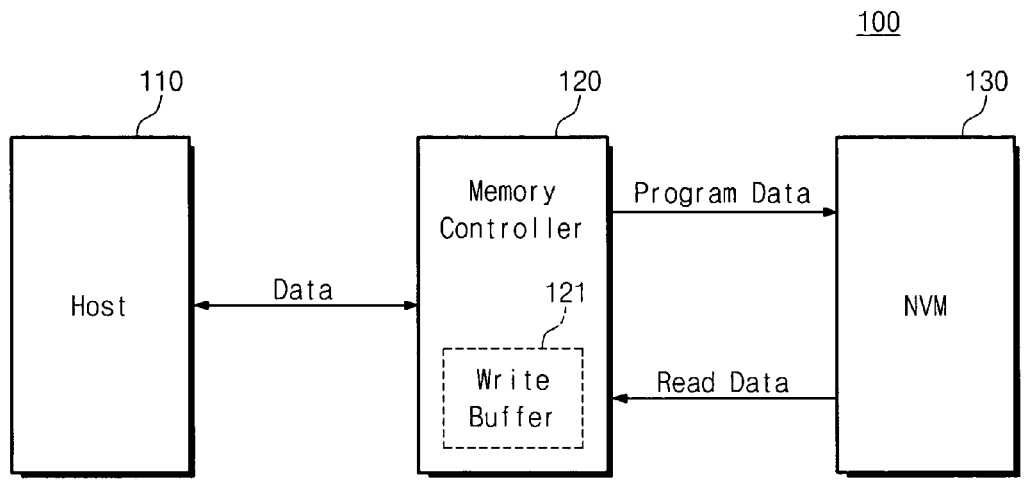

FIG. 9 is a block diagram illustrating a memory system 100 according to example embodiments of the inventive concepts. Referring to FIG. 9, the memory system 100 may include a non-volatile memory device NVM 130 and a memory controller 120 for rearranging data that may be stored in the non-volatile memory device 130. A host 110 may request the memory controller 120 to store data and read stored data if necessary. The host 110 may provide a general access request, but may not control data arrangement and a reading order according to example embodiments of the inventive concepts.

The memory controller 120 may store program data provided from the host 110 in a write buffer 121. The write buffer 121 may be configured with a First-In-Last-Out (FILO) method in which first inputted data is outputted last. However, the write buffer 121 is not limited to a buffer of the FILO method to realize the above-mentioned data arrangements of various example methods. In order to realize various embodiments, the memory controller 120 may rearrange data stored in the write buffer 121. The rearranged data may be sequentially provided to the non-volatile memory device 130 as program data.

The memory controller 120 may read data according to an inverse reading order defined in each of the embodiments during a read operation. The read data may be provided to the host 110 without an additional arrangement processing operation. The inverse reading order may itself correspond to an order of stream data that the host 110 may request. In the memory system 100 of FIG. 9, the program and inverse read of example embodiments of the inventive concepts may be entirely controlled by the memory controller 120. For the inverse read operation of example embodiments of the inventive concepts, the memory controller 120 may further include an additional address decoder (not shown) for converting an address provided from the host 110 into one for an inverse read method.

Figure 10:
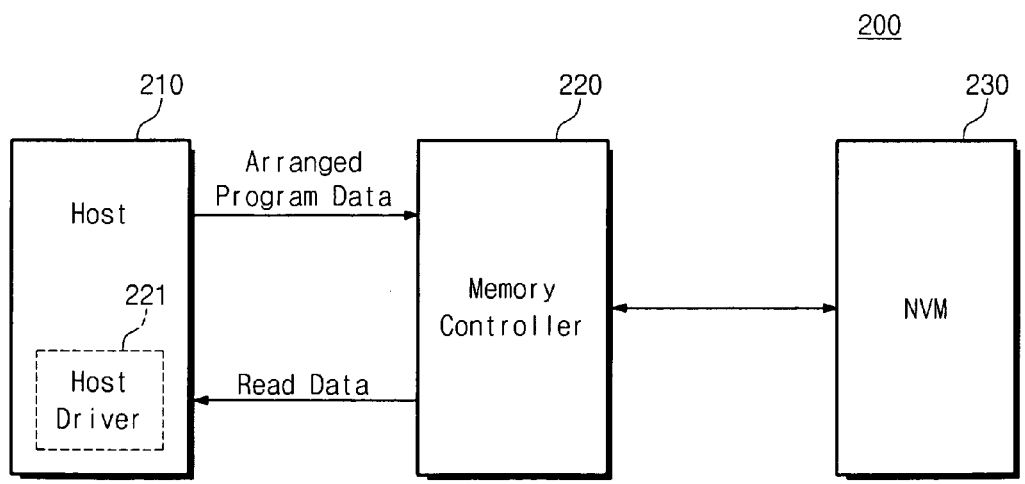

FIG. 10 is a block diagram illustrating a memory system 200 according to example embodiments of the inventive concepts. The memory system 200 may include a non-volatile memory device NVM 230 and a memory controller 220 for controlling the non-volatile memory device 230. In the memory system 200, rearrangement of data may be accomplished in a host 210. A host 210 may request the memory controller 230 to store data and read stored data if necessary. The host 210 may perform rearrangement for write-requested data when an access of a non-volatile memory is requested. The host 210 may add a function for performing data rearrangement of example embodiments of the inventive concepts into a host driver 221 for controlling a memory device.

The host 210 may have a high performance processor and resource. If a function for data rearrangement of FIG. 8, for example, is performed in the host driver 221 of the host 210, a heavy load of the memory controller 220 may be reduced and resource allocation may be effectively performed through a method in which processed data is stored in the host and reused. The memory controller 220 may control the non-volatile memory device 230 to store arranged program data according to a control of the host 210. During a read operation, the memory controller 220 may control the non-volatile memory device 230 to detect programmed data according to a rearrangement and may transfer the read data into the host 210.

Figure 11:
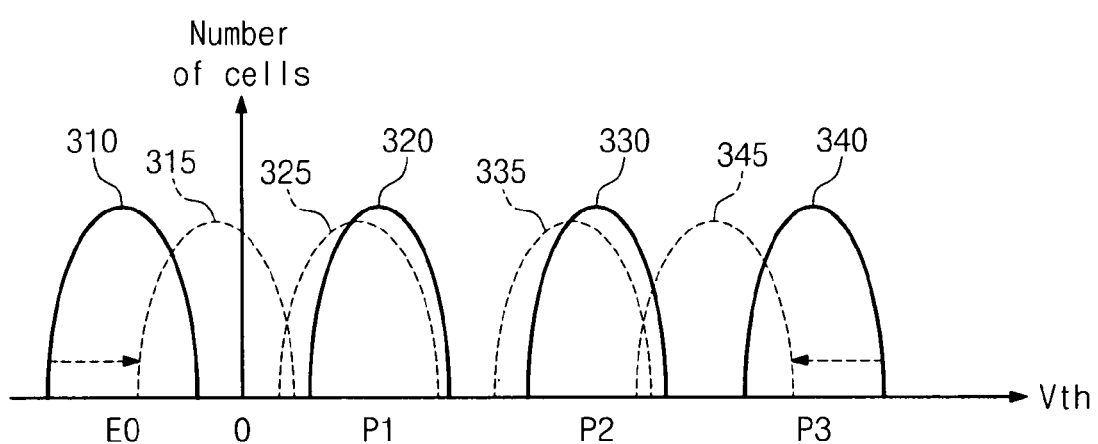

FIG. 11 is a graph illustrating threshold voltage shift phenomena according to example embodiments of the inventive concept. Referring to FIG. 11, threshold voltage distributions of a memory cell storing a 2-bit data may be illustrated. An erase state E0 corresponding to data 11 may have the lowest threshold voltage level. Respective 2-bit data and program states may be arranged with a program state P1 corresponding to data 10, a program state P2 corresponding to data 00, and a program state P3 corresponding to data 01. A relationship of 2-bit data corresponding to the states E0, P1, P2, and P3 is an example. According to example embodiments of the inventive concepts, the states E0, P1, P2, and P3, and 2-bit data corresponding thereto, may vary. Although a 2-bit MLC is illustrated as one example for convenience of description, it is apparent to those skilled in the art that the same technique of example embodiments of the inventive concepts may be applied to a 3-bit MLC or a 4-bit MLC.

In a flash memory device, if a memory cell has a different threshold voltage from adjacent memory cells, the memory cells may affect each other. For example, similar to influence on an adjacent memory cell due to program disturb or lateral charge spreading, and charge loss, a threshold voltage of a memory cell may be increased or decreased according to a threshold voltage of adjacent memory cells. For example, a program disturb or lateral charge spreading phenomenon may be increased between a memory cell programmed with an erase state E0 and a memory cell programmed with a program state P3 having the highest threshold voltage. This may be called an E-P3 property. The feature of a memory cell itself and the influence of an adjacent cell caused by charge loss may have a similar condition, and this may be called data retention. The above mentioned three undesirable phenomena have different factors but their solutions may be similar and description of solutions according to example embodiments may be made based on the E-P3 characteristic.

Referring to FIG. 11, when a memory cell is initially programmed a threshold voltage distribution of memory cells may form distributions 310, 320, 330, and 340, indicated by a solid line. According to, for example, lateral charge spreading and program disturb phenomena, distribution of memory cells corresponding to the distribution 310 may shift to the distribution 315. Memory cells corresponding to the distribution 340 may shift into the distribution 345 according to, for example, a lateral charge spreading or program disturb phenomenon, and charge loss of adjacent memory cells. According to the influence of the various adjacent memory cells, a threshold voltage of memory cells programmed with an erase state E0 may be increased. Memory cells programmed with a program state P3 may have a threshold voltage that is decreased according to, for example, lateral charge spreading or program disturb. If the erase state E0 and the program state P3 having the highest threshold voltage are adjacent, each memory cell may be exposed to increased and/or greatest lateral charge spreading or program disturb relative to other data state pairs. It may be necessary to prevent a condition where memory cells programmed with the erase state E0 and the program state P3 are adjacent or it may be necessary to perform additional data processing to compensate for the adjacent memory cells during a data read operation. Methods for performing compensation of a read operation according to example embodiments of the inventive concepts will now be described.

Figure 12:
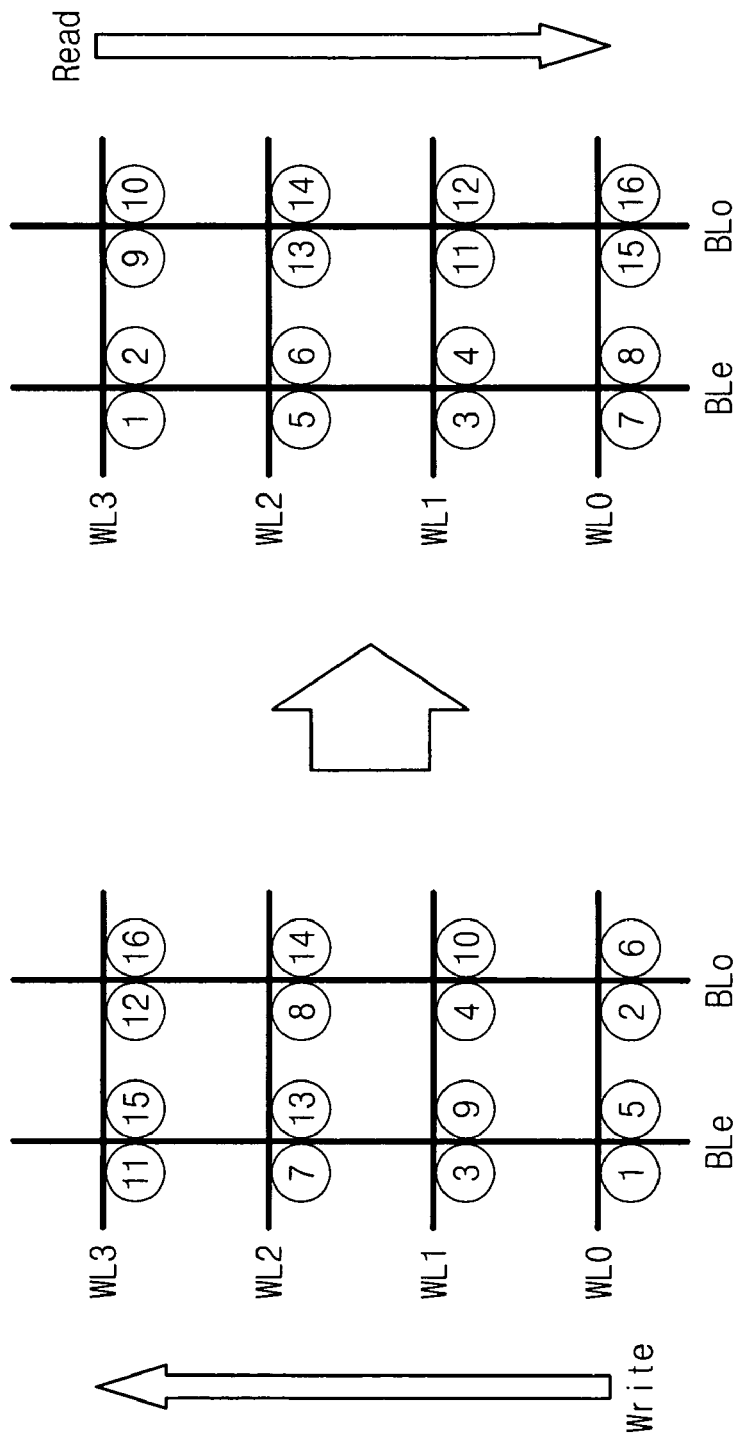

FIG. 12 is a schematic illustrating access methods of example embodiments of the inventive concepts compensating for threshold voltage shift illustrated in FIG. 11 (e.g., due to E-P3). Referring to FIG. 12, according to a reading order, a word line WL3 may be read, a word line WL1 may be read and a word line WL2 may be read sequentially. If at least one of the read word lines WL3 and WL1 corresponds to a program state P3, the word WL2 may be read considering this condition. According to a program state of two adjacent memory cells, a read voltage may be adjusted in order to read a memory cell connected to the word line WL2. Referring to a program state of adjacent memory cells, an optimized and/or improved read voltage may be provided to read accurate data. According to methods for reading data of example embodiments that include initially skipping one word line, interference phenomena caused by a threshold voltage difference between memory cells may be resolved.

Figure 13:
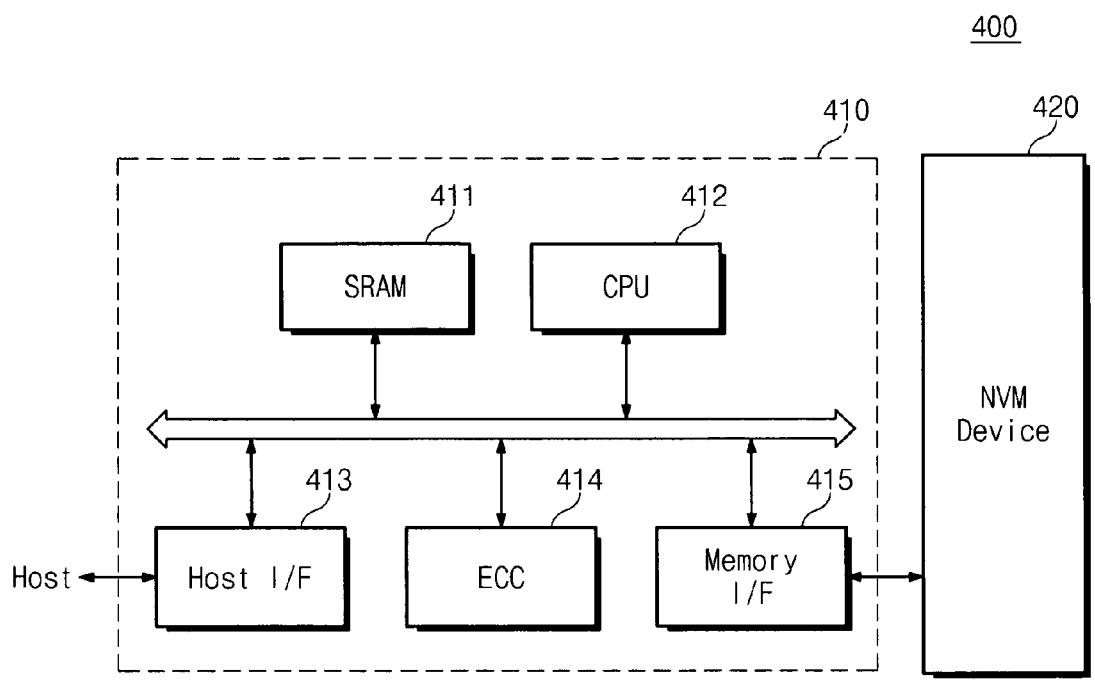

FIG. 13 is a block diagram illustrating memory systems according to example embodiments of the inventive concepts. FIG. 13 is a block diagram illustrating example memory systems 400. Referring to FIG. 13, a memory system 400 may include a non-volatile memory device NVM Device 420 and a memory controller 410. The non-volatile memory device 420 may be configured with a flash memory device. The memory controller 410 may be configured to control the non-volatile memory device 420. The non-volatile memory device 420 and the memory controller 410 may be combined to be provided as a memory card and/or a solid state disk (SSD). A SRAM 411 may serve as an operating memory of a central processing unit (CPU) 412. A host interface (I/F) 413 may include a data exchange protocol of a host connected to the memory system 400. An error code correction block (ECC) 414 may detect and correct an error in data read from the non-volatile memory device 420. The memory interface (I/F) 415 may interface with the non-volatile memory device 420. The CPU 412 may perform overall control operations for data exchange of the memory controller 410.

Although not shown in FIG. 13, it is apparent to those skilled in the art that the memory system 400 may further include a ROM (not shown) for storing code data for interfacing with the host. The non-volatile memory device 420 may be provided with a multi-chip package including a plurality of flash memory chips. The memory system 400 may be provided as a storage media of high and/or increased reliability (e.g., low error rate). A flash memory device of example embodiments of the inventive concepts may be equipped in a memory system such as SSD that is actively under research in recent times. The memory controller 410 may be configured to communicate externally (e.g., to a host) through one of protocols to provide various interfaces, for example, a universal serial bus (USB), a multi media card (MMC), a peripheral component interconnect express (PCI-E), an advanced technology attachment (ATA), a serial advanced technology attachment (SATA), a parallel advanced technology attachment (PATA), a small computer system interface (SCSI), an enhanced small disk interface (ESDI), and/or an integrated drive electronics (IDE).

The memory controller 410 may access the non-volatile memory device 420 using a method according to example embodiments of the inventive concepts. During an inverse read including rearranging data provided during a program operation, the read data may be provided as stream data requested by a host. The memory controller 410 may additionally receive manufacturing parameters, disturb, retention, the number of program-erase cycles (P/E cycles), and/or characteristics obtained from a pilot cell, in order to more accurately estimate coupling or retention characteristics. According to example embodiments of the inventive concepts the above functions may or may not be controlled by the memory controller 410 as described above and example embodiments are not limited to the described example embodiment. For example, a memory system may be designed to perform the above-mentioned functions in the non-volatile memory device 420.

Figure 14:
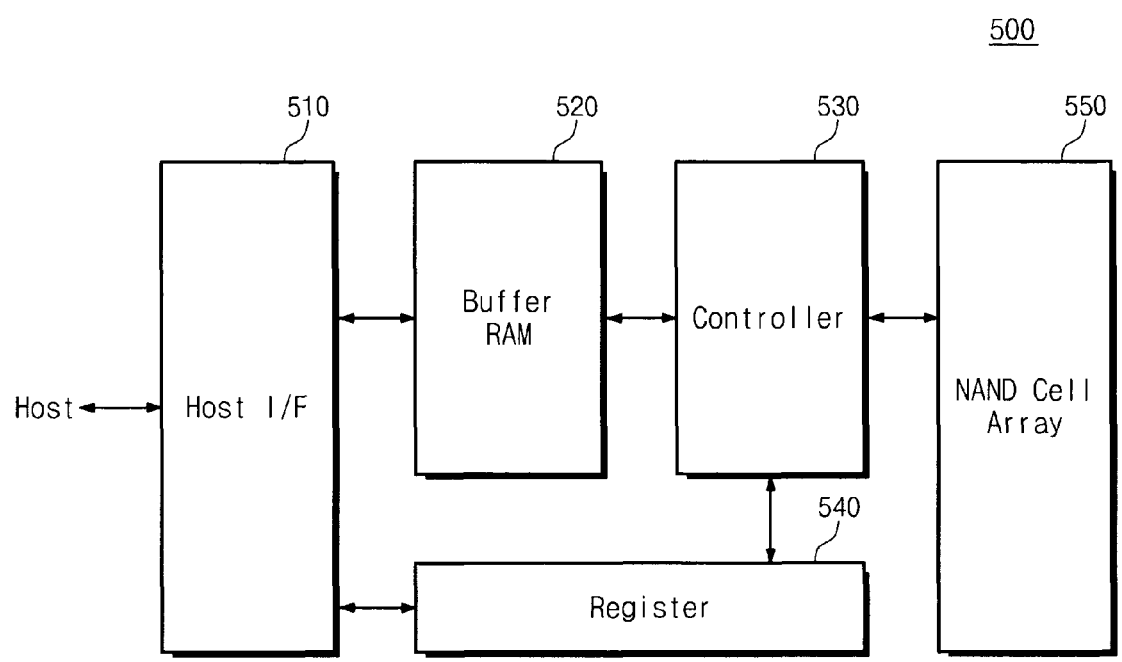

FIG. 14 is a block diagram illustrating fusion memory devices according to example embodiments of the inventive concepts. FIG. 14 may illustrate fusion memory devices and/or fusion memory systems 500 for performing a program operation according to example embodiments. For example, example embodiments of the inventive concepts may be applied to a NAND flash memory device 500 as a fusion memory device.

A NAND flash memory device 500 may include a host interface (I/F) 510, a buffer RAM 520, a controller 530, a register 540, and a NAND cell array 550. The host I/F 510 may exchange a variety of information with a device through a different protocol. The buffer RAM 520 may have a built-in code or may store data temporarily. The controller 530 may control read and program operations, and all states, in response to a control signal and a command given from the Host I/F 510. The register 530 may include data, for example, instructions, addresses and/or configurations that define a system operating environment in a memory device. The NAND cell array 550 may include a non-volatile memory cell and a page buffer. In response to a write request from a host, the NAND flash memory device 500 may rearrange data according to a writing order while considering interference of aggressor cells. The rearranged data may be written into the NAND cell array 550.

Figure 15:
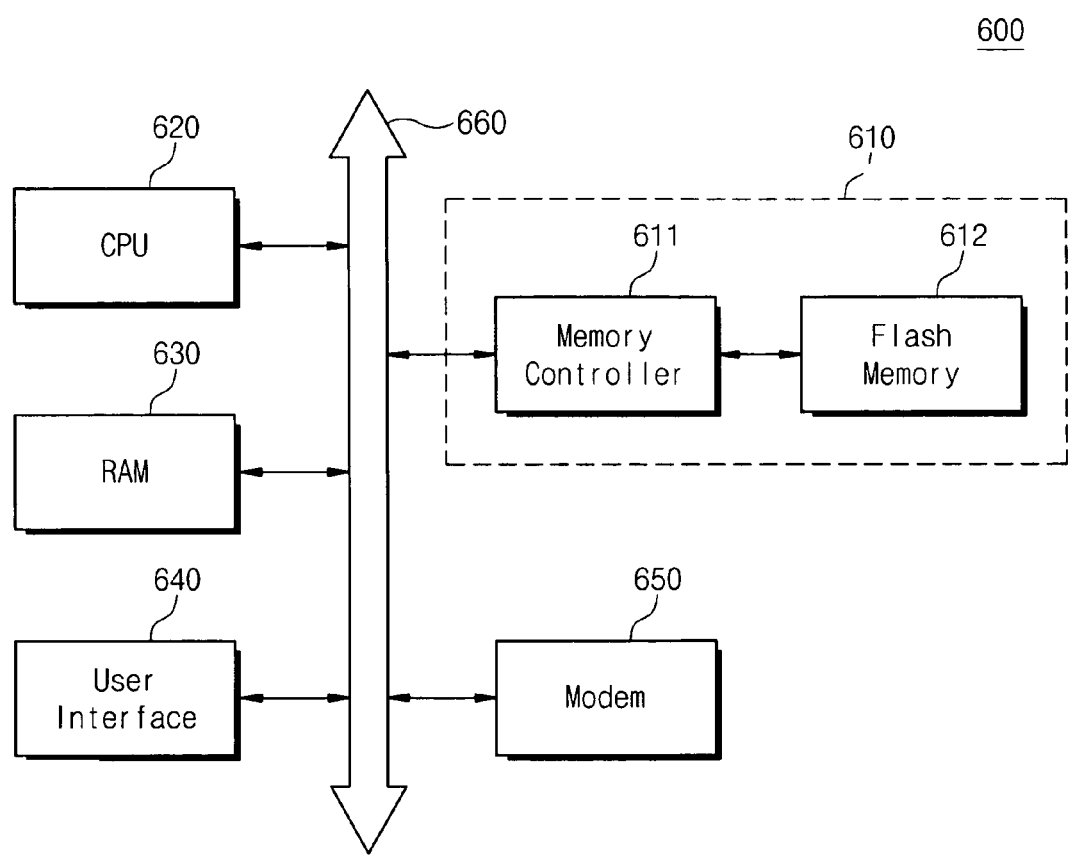

FIG. 15 is a block diagram illustrating a configuration of computing systems according to example embodiments of the inventive concepts. FIG. 15 may illustrate computing systems 600 including a flash memory 612. A computing system 600 may include, for example, a CPU 620, a RAM 630, a user interface 640, a modem 650 (e.g., a baseband chipset) and a memory system 610, which may be electrically connected to a system bus 660. The memory system 610 may include a flash memory 612 and a memory controller 611. If the computing system 600 is a mobile device, a battery (not shown) may be additionally provided to supply an operating voltage of the computing system 600. Although not illustrated in the drawing, it is apparent to those skilled in the art that an application chipset, a cameral image processor (CIS), a mobile DRAM, and the like, may be further provided in a computing system 600.

The memory system 610 may constitute, for example, a SSD using a non-volatile memory to store data. The memory system 610 may be provided as, for example, a function flash memory (e.g., one NAND flash memory). A computing system 600 may restore damaged data of victim cells with reference to data of aggressor cells. Data of aggressor cells may be read first to be used as a resource such that the damaged data of victim cells may be restored. Even if data stored in the aggressor cells are read first by rearranging a program sequence, they may be provided as a necessary stream data to the host.

The rearrangement of data to be programmed may be performed in the memory system 610 or may be performed according to a control of the CPU 620 of the computing system 600. For effective and/or improved resource usage, the data rearrangement process may be performed by sharing data with the memory system 610 and the CPU 620.

The flash memory device 612 and/or memory controller 611 may be mounted using various types of packages. For example, the package types may include Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and/or Wafer-Level Processed Stack Package (WSP).

According to example embodiments of the inventive concepts, a storage device having high and/or increased speed access and highly reliable data (e.g., increased reliability) may be provided. Example embodiments of the inventive concepts may use a non-volatile memory device to describe technical features. However, advantages of example embodiments of the inventive concepts are not limited to a non-volatile memory device and a memory system including the same. An access method or a control method of example embodiments of the inventive concepts may be applied to various storage devices (e.g., a hard disk drive (HDD), an optical disk drive (ODD), and/or a volatile memory device).

While example embodiments have been particularly shown and described, it will be understood by one of ordinary skill in the art that variations in form and detail may be made therein without departing from the spirit and scope of the claims.

What is claimed is:

1. A method of accessing a storage device, the method comprising:
    rearranging a writing order of first and second data according to a reading order; and
    writing the first and second data into first and second storage regions of the storage device according to the rearranged writing order,
    wherein the reading order reads data of the second storage region first, the second storage region interfering with the first storage region.

2. The method of claim 1, wherein the first data is to be output first, and
    the first data is written to the second storage region.

3. The method of claim 1, further comprising:
    temporarily storing the first and second data for the rearranging of the writing order.

4. The method of claim 1, further comprising:
    reading the second data from the second storage region;
    storing the read second data in a third storage region;
    determining whether the first data is damaged by reading the first data from the first storage region; and
    upon determining that the first data is damaged, restoring the first data according to a degree of the interference of the second storage region, the degree of the interference determined with reference to the second data.

5. The method of claim 4, wherein the restoring of the first data includes rereading the first storage region with a reading condition adjusted according to the degree of the interference.

6. The method of claim 4, wherein the restoring of the first data includes detecting and correcting an error of the damaged first data with reference to the degree of the interference.

7. The method of claim 1, wherein the first and second data are each a page of data.

8. The method of claim 1, wherein the storage device includes a plurality of non-volatile multi-level memory cells.

* * * * *